(12) United States Patent
Li et al.

(10) Patent No.: US 12,238,196 B2
(45) Date of Patent: Feb. 25, 2025

(54) LINEARITY TEST SYSTEM, LINEARITY SIGNAL PROVIDING DEVICE, AND LINEARITY TEST METHOD

(71) Applicant: REALTEK SEMICONDUCTOR CORP., Hsinchu (TW)

(72) Inventors: Meng-Che Li, Hsinchu (TW); Bo-Kai Huang, Hsinchu (TW)

(73) Assignee: REALTEK SEMICONDUCTOR CORP., Hsinchu (TW)

( * ) Notice: Subject to any disclaimer, the term of this patent is extended or adjusted under 35 U.S.C. 154(b) by 594 days.

(21) Appl. No.: 17/479,115

(22) Filed: Sep. 20, 2021

(65) Prior Publication Data

US 2022/0321320 A1   Oct. 6, 2022

(30) Foreign Application Priority Data

Mar. 31, 2021 (TW) ................. 110111831

(51) Int. Cl.
*H04L 7/033* (2006.01)
*G01R 31/3183* (2006.01)

(52) U.S. Cl.
CPC .......... *H04L 7/033* (2013.01); *G01R 31/3183* (2013.01)

(58) Field of Classification Search
CPC ............ G01R 31/3183; G01R 31/3167; G01R 31/31726; G01R 31/31727; H04L 7/033
See application file for complete search history.

(56) References Cited

U.S. PATENT DOCUMENTS

2007/0252735 A1* 11/2007 Shi ................... G01R 31/31727
341/118
2011/0248733 A1* 10/2011 Kantake .......... G01R 31/31726
324/750.01

FOREIGN PATENT DOCUMENTS

WO   WO-2010023583 A1 *  3/2010   ......... G01R 31/3167
WO   WO-2010026642 A1 *  3/2010   ....... G01R 31/31726

* cited by examiner

*Primary Examiner* — Shelly A Chase
(74) *Attorney, Agent, or Firm* — Li & Cai Intellectual Property (USA) Office

(57) ABSTRACT

A linearity test system for a chip, a linearity signal providing device, and a linearity test method for the chip are provided. The linearity test method for the chip includes steps as follows: providing a reference clock signal and a receiver input signal to a chip under test, wherein the reference clock signal and the receiver input signal have a phase difference in time domain; and determining a linearity of a phase interpolator of the chip under test based on a plurality of phase signals of the chip under test corresponding to the reference clock signal and the receiver input signal.

8 Claims, 4 Drawing Sheets

LINEARITY TEST SYSTEM, LINEARITY SIGNAL PROVIDING DEVICE, AND LINEARITY TEST METHOD

CROSS-REFERENCE TO RELATED PATENT APPLICATION

This application claims the benefit of priority to Taiwan Patent Application No. 110111831, filed on Mar. 31, 2021. The entire content of the above identified application is incorporated herein by reference.

Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE DISCLOSURE

The present disclosure relates to a linearity test system, a linearity signal providing device, and a linearity test method, and more particularly to a linearity signal providing device, a linearity test system, and a linearity test method that have low cost.

BACKGROUND OF THE DISCLOSURE

In conventional technologies, when a linearity test of a phase interpolator of a chip is established, internal phase signal pins are applied to the chip to output phase signals to the oscilloscope for measurement, which results in a high testing cost.

Therefore, providing a low-cost linearity test system for a chip, a linearity signal providing device, and a linearity test method for a chip have become one of the important issues to be addressed in the industry.

SUMMARY OF THE DISCLOSURE

In response to the above-referenced technical inadequacy, the present disclosure provides a linearity test method. The linearity test method includes steps as follows: providing a reference clock signal and a receiver input signal to a chip under test, wherein the reference clock signal and the receiver input signal have a phase difference in time domain; and determining a linearity of the chip under test based on a plurality of phase signals of the chip under test corresponding to the reference clock signal and the receiver input signal.

In another aspect, the present disclosure provides a linearity test system. The linearity test system for a chip includes a linearity signal providing device and a chip under test. The linearity signal providing device provides a reference clock signal and a receiver input signal. The reference clock signal and the receiver input signal have a phase difference in time domain. The chip under test receives the reference clock signal and the receiver input signal to process a linearity test.

In yet another aspect, the present disclosure provides a linearity signal providing device. The linearity signal providing device includes a controller, a first signal generation circuit, a second signal generation circuit, a data delay circuit, a first output circuit, and a second output circuit. The first signal generation circuit is electrically connected to the controller to generate a reference clock signal. The second signal generation circuit is electrically connected to the controller to generate an original receiver input signal. The data delay circuit is electrically connected to the second signal generation circuit. A receiver input signal is generated after the original receiver input signal is transmitted through the data delay circuit. The receiver input signal and the reference clock signal have a phase difference in time domain. The first output circuit is electrically connected to the first signal generation circuit. The second output circuit is electrically connected to the data delay circuit to output the receiver input signal. When the linearity signal providing device is connected to a chip under test to process a linearity test, the controller of the linearity signal providing device transmits a first control signal to the first signal generation circuit to output the reference clock signal to the chip under test by the first output circuit. The controller of the linearity signal providing device also transmits a second control signal to the second signal generation circuit at the same time to output the receiver input signal to the chip under test by the second output circuit.

Therefore, the linearity test system for a chip, the linearity signal providing device, and the linearity test method for a chip provided in the present disclosure provide only two signals with a phase difference in time domain to the chip under test, so that a linearity analysis can be performed using the jitter tolerance test, thereby allowing the testing cost and time to be greatly reduced.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The described embodiments may be better understood by reference to the following description and the accompanying drawings, in which.

DETAILED DESCRIPTION OF THE EXEMPLARY EMBODIMENTS

Figure 1:
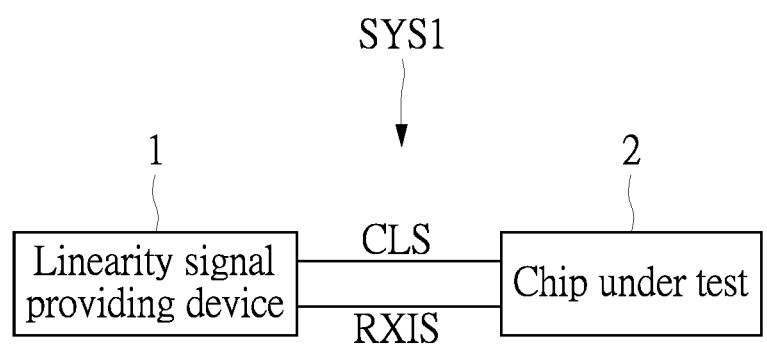
FIG. 1 is a schematic view of a linearity test system for a chip according to a first embodiment of the present disclosure.

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a", "an", and "the" includes plural reference, and the meaning of "in" includes "in" and "on". Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way.

Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first", "second" or "third" can be used to describe various components, signals or the like, which are for distinguishing one component/signal from another one only, and are not intended to, nor should be construed to impose any substantive limitations on the components, signals or the like.

First Embodiment

A linearity signal providing device of the present disclosure provides a reference clock signal and a receiver input signal at the same time, and outputs the reference clock signal and the receiver input signal that have a phase difference in time domain to a chip. A jitter tolerance test is processed to obtain available phases of the chip. When the linearity of the chip is good, the available phases of the two signals having phase differences in time domain are similar. When the linearity of the chip is bad, quantities of the available phases of the two signals having phase differences in time domain are different.

Figure 2:
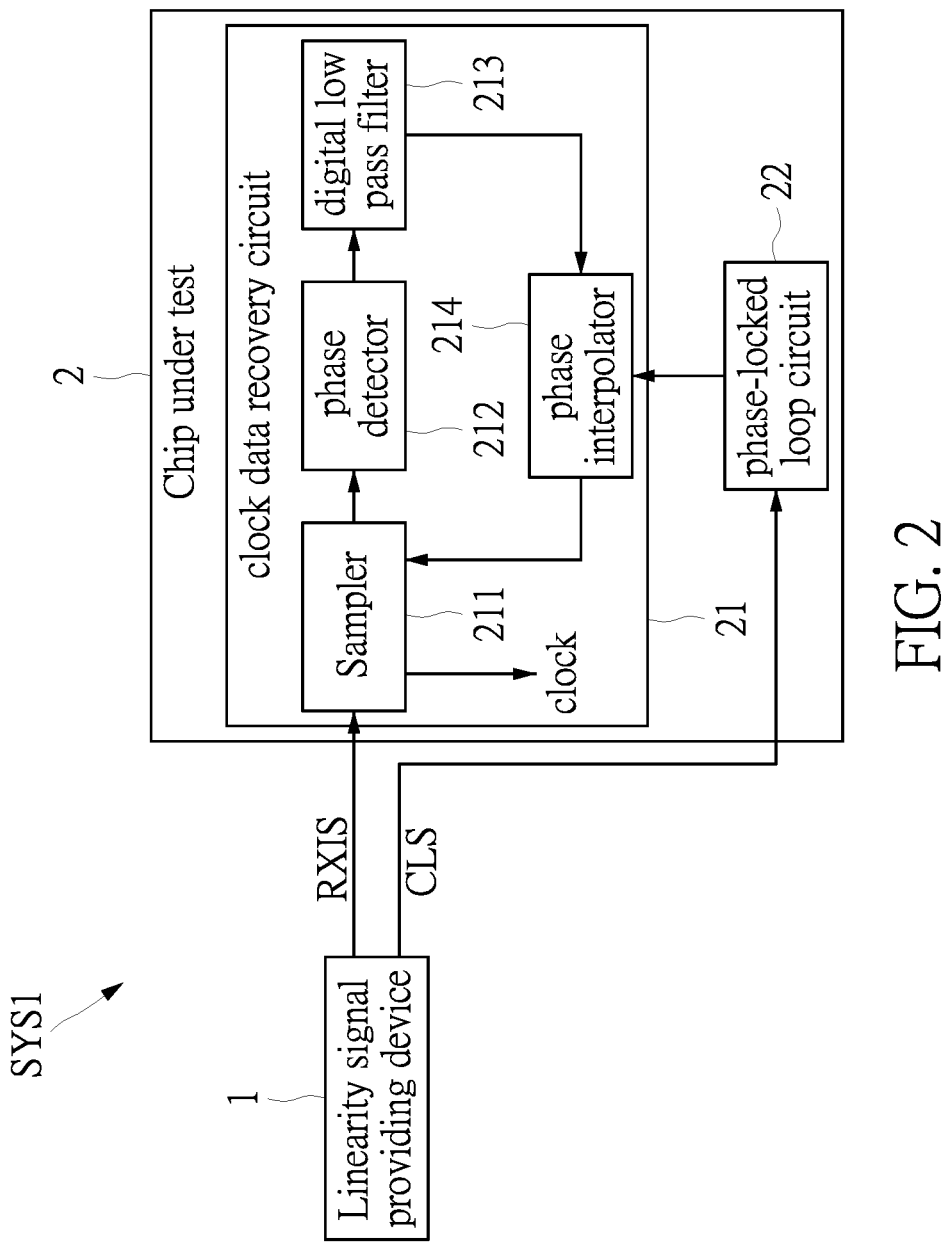
FIG. 2 is an alternative schematic view of the linearity test system for the chip according to the first embodiment of the present disclosure.
Figure 3:
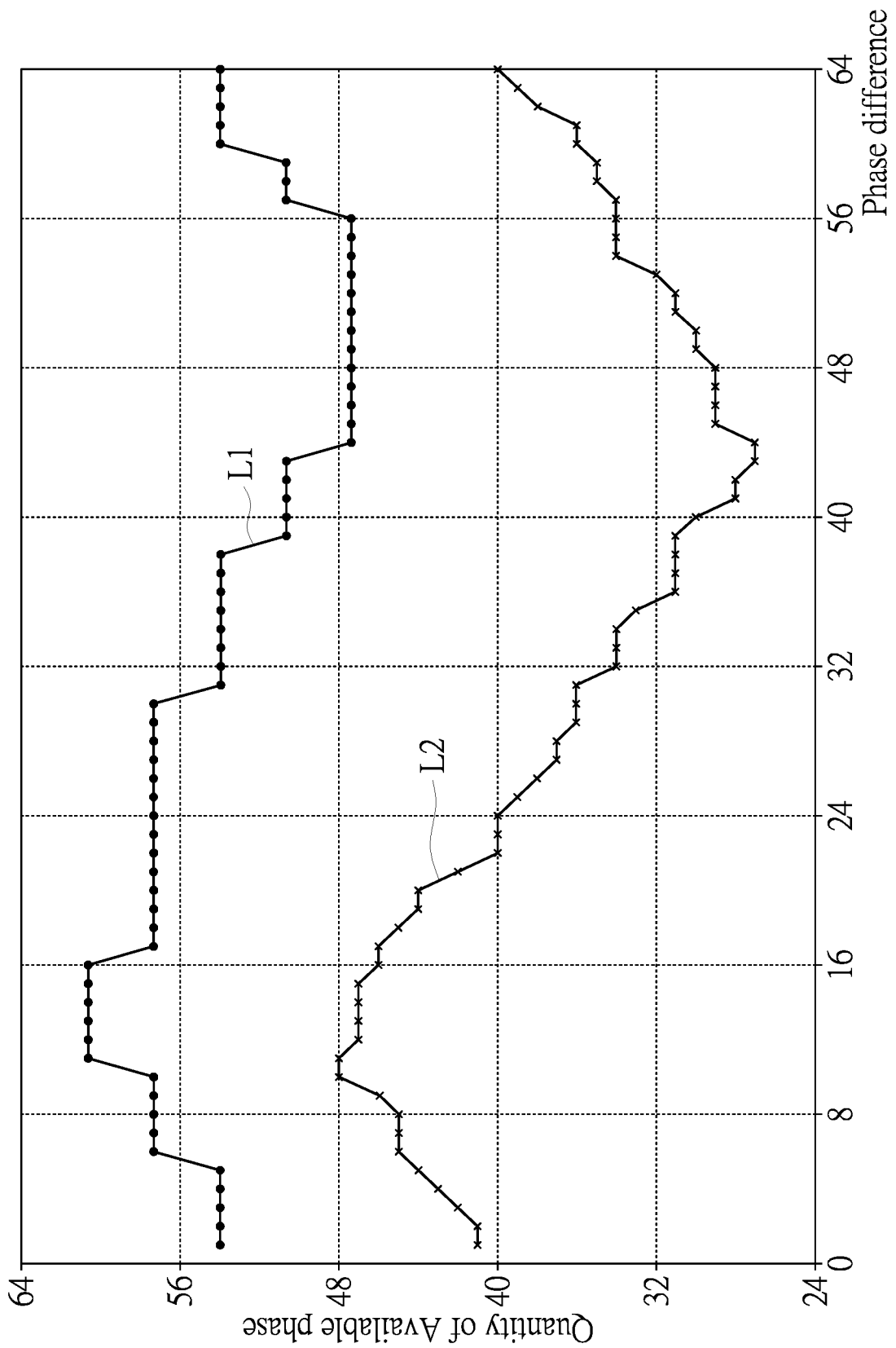
FIG. 3 is a schematic view of a jitter tolerance test of the linearity test system of the present disclosure.

Referring to FIG. 1, FIG. 2, and FIG. 3, FIG. 1 is a schematic view of a linearity test system for a chip according to a first embodiment of the present disclosure. FIG. 2 is another schematic view of the linearity test system for the chip according to the first embodiment of the present disclosure. FIG. 3 is a schematic view of a jitter tolerance test of the linearity test system of the present disclosure.

A linearity test system for a chip SYS1 includes a linearity signal providing device 1 and a chip under test 2.

The linearity signal providing device 1 provides a reference clock signal CLS and a receiver input signal RXIS. A phase difference in time domain is defined between the reference clock signal CLS and the receiver input signal RXIS.

The chip under test 2 is configured to receive the reference clock signal CLS and the receiver input signal RXIS to process a linearity test.

Referring to FIG. 2, the chip under test 2 at least includes a clock data recovery circuit 21 and a phase-locked loop circuit 22. The clock data recovery circuit 21 is electrically connected to the phase-locked loop circuit 22. The phase-locked loop circuit 22 is configured to receive the reference clock signal CLS. The clock data recovery circuit 21 is configured to receive the receiver input signal RXIS.

The clock data recovery circuit 21 includes a sampler 211, a phase detector 212, a digital low pass filter 213, and a phase interpolator 214. The sampler 211 is electrically connected to the phase detector 212. The phase detector 212 is electrically connected to the digital low pass filter 213.

The phase interpolator 214 is electrically connected to the digital low pass filter 213 and the sampler 211.

In addition, the sampler 211 is configured to output a recovered clock signal and data.

Furthermore, the linearity signal providing device 1 can provide the reference clock signal CLS and the receiver input signal RXIS at the same time.

In addition, as shown in FIG. 3, the higher the quantity of the available phases is, the denser the internal interpolation phases are, and the lower the quantity of the available phases is, the sparser the internal interpolation phases are. In other words, when the phase difference in time domain has more available phases, the jitter tolerance test is better, otherwise, the jitter tolerance test is worse. A curve L1 is a jitter tolerance test result of phase difference in time domain of the reference clock signal CLS and the receiver input signal RXIS. A curve L2 represents the quantities of the available phases corresponding to different phase differences in time domain of the reference clock signal CLS and the receiver input signal RXIS. In addition, a horizontal label of the chart in FIG. 3 is "phase difference", and an interval of phase difference of the horizontal axis is "125/64 picoseconds".

When the phase difference in time domain of the reference clock signal CLS and the receiver input signal RXIS is between 19.5 picoseconds ((10/64)*1 UI, (1 UI=125 picoseconds)) and 29.3 picoseconds ((15/64)*1 UI, (1 UI=125 picoseconds)), the quantity of the available phases is greater than 45. When the phase difference in time domain of the reference clock signal CLS and the receiver input signal RXIS is between 80 picoseconds ((41/64)*1 UI) and 93.8 picoseconds ((48/64)*1 UI), the quantity of the available phase is less than 30. Based on the jitter tolerance test, when the quantity of the available phase is greater than 45, the clock data recovery circuit can process the jitter that is less than 0.5 UI (62.5 picoseconds). However, when the quantity of the available phase is less than 30, the clock data recovery circuit processes the jitter that is less than 0.35 UI (43.75 picoseconds).

In addition, the linearity can be determined based on a preset quantity of the available phases. For example, when the quantity of the available phases is equal to or greater than the preset quantity of the available phases, the linearity of the chip 2 is determined as "good". When the quantity of the available phases is less than the preset quantity of the available phases, the linearity of the chip 2 is determined as "bad".

Second Embodiment

Figure 4:
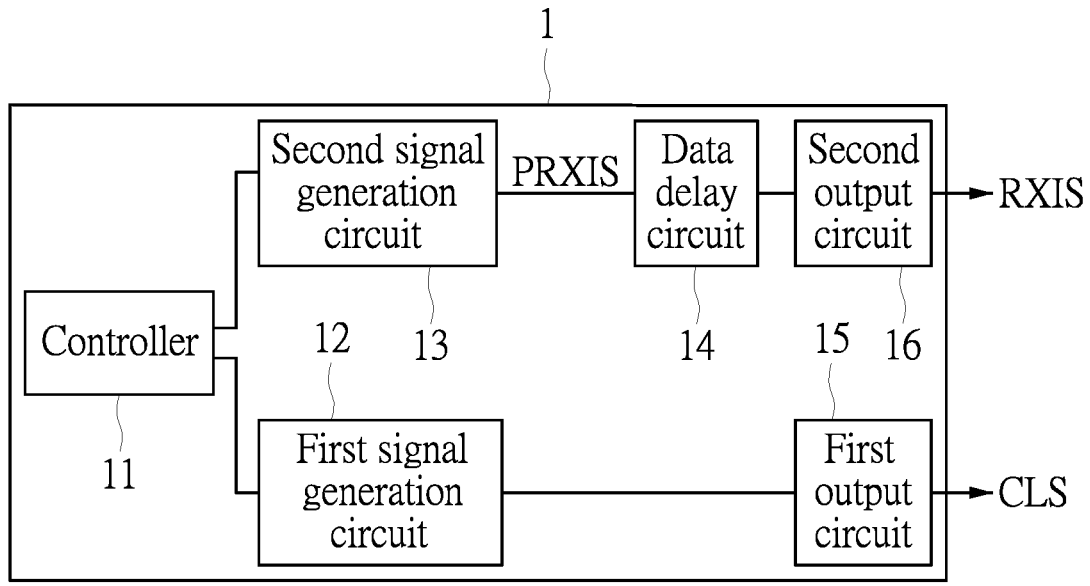
FIG. 4 is a schematic view of a linearity signal providing device according to a second embodiment of the present disclosure.

Referring to FIG. 4, FIG. 4 is a schematic view of a linearity signal providing device according to a second embodiment of the present disclosure The linearity signal providing device 1 includes a controller 11, a first signal generation circuit 12, a second signal generation circuit 13, a data delay circuit 14, a first output circuit 15, and a second output circuit 16.

The controller 11 is electrically connected to the first signal generation circuit 12 and the second signal generation circuit 13. The first signal generation circuit 12 is electrically connected to the first output circuit 15. The second signal generation circuit 13 is electrically connected to the data delay circuit 14. The data delay circuit 14 is electrically connected to the second output circuit 16.

The first signal generation circuit 12 is configured to generate the reference clock signal CLS. The second signal generation circuit 13 is configured to generate the receiver input signal RXIS. The receiver input signal RXIS and the reference clock signal have the phase difference in time domain therebetween. In other words, when the first signal generation circuit 12 and the second signal generation circuit 13 generate signals, waveforms of the reference clock signal CLS and the receiver input signal RXIS are the same. However, an original receiver input signal PRXIS generated by the second signal generation circuit 13 is processed by the data delay circuit 14, and is modulated as the receiver input signal RXIS by combining a time delay. Therefore, the receiver input signal RXIS and the reference clock signal CLS have a phase difference in time domain.

When the linearity signal providing device 1 is connected to the chip under test 2 to process the linearity test, the linearity signal providing device 1 transmits a first control signal to the first signal generation circuit 12 to output a reference clock signal CLS to the chip under test 2 by the first output circuit 15. The controller 11 of the linearity signal providing device 1 also transmits a second control signal to the second signal generation circuit 13 at the same time to output the receiver input signal RXIS to the chip under test 2 by the second output circuit 16.

Third Embodiment

Figure 5:
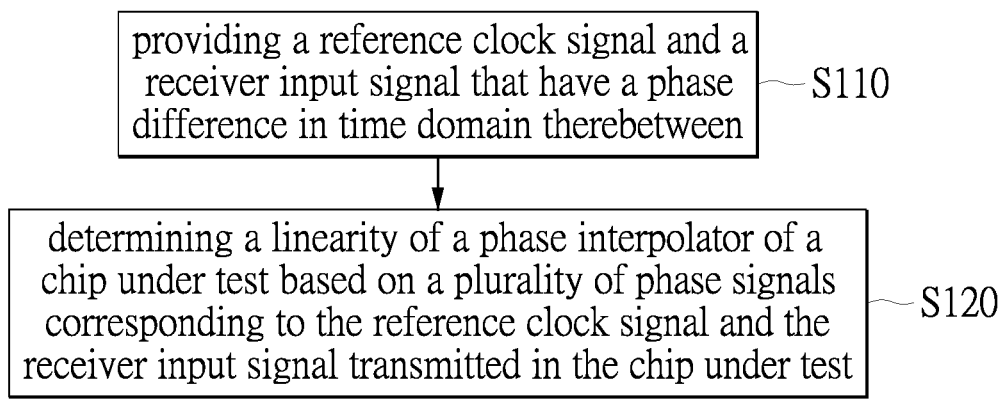
FIG. 5 is a schematic view of a linearity test method for the chip according to a third embodiment of the present disclosure.

Referring to FIG. 5, FIG. 5 is a schematic view of a linearity test method for the chip according to a third embodiment of the present disclosure.

The method for testing a linearity of a chip is adapted to the linearity test system for the chip SYS1 of the first embodiment and the linearity signal providing device 1 of the second embodiment, and it is not limited thereto. The structure and the function of the linearity test system for the chip SYS1 and the linearity signal providing device 1 is omitted herein.

The linearity test method of the chip includes following steps:
  providing a reference clock signal and a receiver input signal that have a phase difference in time domain (step S110); and
  determining a linearity of a phase interpolator of a chip under test based on a plurality of phase signals corresponding to the reference clock signal and the receiver input signal transmitted in the chip under test (step S120).

In step S110, the linearity test system for the chip SYS1 includes the linearity signal providing device 1 and the chip under test 2.

The linearity signal providing device 11 provides the reference clock signal CLS and the receiver input signal RXIS. The reference clock signal CLS and the receiver input signal RXIS have a phase difference in time domain.

The chip under test 2 receives the reference clock CLS and the receiver input signal RXIS to process a linearity test.

The chip under test at least includes the clock data recovery circuit 21 and the phase-locked loop circuit 22. The clock data recovery circuit 21 is electrically connected to the phase-locked loop circuit 22. The phase-locked loop circuit 22 is configured to receive the reference clock signal CLS. The clock data recovery circuit 21 is configured to receive the receiver input signal RXIS.

In some embodiments, the clock data recovery circuit 21 includes the sampler 211, the phase detector 212, the digital low pass filter 213, and the phase interpolator 214, and the connection relationship of the above elements can be referred to in FIG. 2.

The sampler 211 is configured to output the recovered clock signal and data.

The linearity signal providing device 1 can provide the reference clock signal CLS and the receiver input signal RXIS at the same time.

In step S120, the linearity of the chip is determined by the quantity of available phases in the jitter tolerance test. A higher quantity of the available phases corresponds to denser internal interpolation phases, and a lower quantity of the available phases corresponds to sparser internal interpolation phases. In other words, when the phase difference in time domain has more available phases, the jitter tolerance test is good, otherwise, the jitter tolerance test is bad.

Beneficial Effects of the Embodiments

In conclusion, the linearity test system for a chip, the linearity signal providing device, and the linearity test method for a chip provided in the present disclosure only provide two signals with a phase difference in time domain to the chip under test, and the jitter tolerance test can be processed for linearity analysis such that the test cost and time can be greatly reduced.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. A linearity test method for a chip, comprising:
  providing a reference clock signal and a receiver input signal to a chip under test, wherein the reference clock signal and the receiver input signal have a phase difference in time domain; and
  determining a linearity of the chip under test based on a plurality of phase signals of the chip under test corresponding to the reference clock signal and the receiver input signal,
  wherein the chip under test includes a clock data recovery circuit and a phase-locked loop circuit, the clock data recovery circuit is electrically connected to the phase-locked loop circuit, the phase-locked loop circuit receives the reference clock signal, and the clock data recovery circuit receives the receiver input signal.

2. The linearity test method according to claim 1, wherein the clock data recovery circuit includes a sampler, a phase detector, a digital low pass filter, and a phase interpolator, the sampler is electrically connected to the phase detector, the phase detector is electrically connected to the digital low pass filter, and the phase interpolator is electrically connected to the digital low pass filter and the sampler.

3. The linearity test method according to claim 2, wherein the reference clock signal and the receiver input signal are provided at the same time by a linearity signal providing device.

4. A linearity test system for a chip, comprising:
  a linearity signal providing device for providing a reference clock signal and a receiver input signal, wherein the reference clock signal and the receiver input signal have a phase difference in time domain; and a chip under test receiving the reference clock signal and the receiver input signal to perform a linearity test, wherein the chip under test at least includes a clock data recovery circuit and a phase-locked loop circuit, the clock data recovery circuit is electrically connected to the phase-locked loop circuit, the phase-locked loop circuit receives the reference clock signal, and the clock data recovery circuit receives the receiver input signal.

5. The linearity test system according to claim 4, wherein the clock data recovery circuit includes a sampler, a phase detector, a digital low pass filter, and a phase interpolator, the sampler is electrically connected to the phase detector, the phase detector is electrically connected to the digital low pass filter, and the phase interpolator is electrically connected to the digital low pass filter and the sampler; wherein the linearity signal providing device provides the reference clock signal and the receiver input signal at the same time.

6. The linearity test system according to claim 4, wherein the linearity signal providing device includes:
- a controller;
- a first signal generation circuit being electrically connected to the controller to generate the reference clock signal;
- a second signal generation circuit being electrically connected to the controller to generate an original receiver input signal;
- a data delay circuit being electrically connected to the second signal generation circuit, the receiver input signal being generated after the original receiver input signal is transmitted through the data delay circuit, the receiver input signal and the reference clock signal having a phase difference in time domain therebetween;
- a first output circuit being electrically connected to the first signal generation circuit; and
- a second output circuit being electrically connected to the data delay circuit to output the receiver input signal.

7. The linearity test system according to claim 6, wherein, when the linearity signal providing device is connected to a chip under test to perform a linearity test, the controller of the linearity signal providing device transmits a first control signal to the first signal generation circuit to output the reference clock signal to the chip under test by the first output circuit, and the controller of the linearity signal providing device also transmits a second control signal to the second signal generation circuit at the same time to output the receiver input signal to the chip under test by the second output circuit.

8. A linearity signal providing device, comprising:
- a controller;
- a first signal generation circuit being electrically connected to the controller to generate a reference clock signal;
- a second signal generation circuit being electrically connected to the controller to generate an original receiver input signal;
- a data delay circuit being electrically connected to the second signal generation circuit, a receiver input signal being generated after the original receiver input signal is transmitted through the data delay circuit, wherein the receiver input signal and the reference clock signal have a phase difference in time domain therebetween;
- a first output circuit being electrically connected to the first signal generation circuit; and
- a second output circuit being electrically connected to the data delay circuit to output the receiver input signal;

wherein, when the linearity signal providing device is connected to a chip under test to perform a linearity test, the controller of the linearity signal providing device transmits a first control signal to the first signal generation circuit to output the reference clock signal to the chip under test by the first output circuit, and the controller of the linearity signal providing device also transmits a second control signal to the second signal generation circuit at the same time to output the receiver input signal to the chip under test by the second output circuit.

\* \* \* \* \*